US011076071B2

(12) United States Patent
Nicholson et al.

(10) Patent No.: US 11,076,071 B2
(45) Date of Patent: Jul. 27, 2021

(54) DEVICE HAVING A CAMERA OVERLAID BY DISPLAY AND METHOD FOR IMPLEMENTING SAME

(71) Applicant: Lenovo (Singapore) Pte. Ltd., New Tech Park (SG)

(72) Inventors: John Weldon Nicholson, Cary, NC (US); Daryl Cromer, Cary, NC (US); Howard J. Locker, Cary, NC (US)

(73) Assignee: LENOVO (SINGAPORE) PTE. LTD., New Tech Park (SG)

( * ) Notice: Subject to any disclaimer, the term of this patent is extended or adjusted under 35 U.S.C. 154(b) by 0 days.

(21) Appl. No.: 16/406,194

(22) Filed: May 8, 2019

(65) Prior Publication Data
US 2020/0358930 A1   Nov. 12, 2020

(51) Int. Cl.
H04N 5/225 (2006.01)
G06F 3/0481 (2013.01)
H04N 5/232 (2006.01)
H01L 27/146 (2006.01)
G06F 9/30 (2018.01)

(52) U.S. Cl.
CPC ....... *H04N 5/2252* (2013.01); *G06F 3/04812* (2013.01); *G06F 9/3004* (2013.01); *H01L 27/14603* (2013.01); *H04N 5/23229* (2013.01)

(58) Field of Classification Search
CPC .............. H04N 5/2252; H04N 5/23229; G06F 3/04812; G06F 9/3004; H01L 27/14603
See application file for complete search history.

(56) References Cited

U.S. PATENT DOCUMENTS

| | | | | |
|---|---|---|---|---|
| 2010/0066800 | A1* | 3/2010 | Ryf | H04N 7/144 348/14.01 |
| 2011/0102308 | A1* | 5/2011 | Nakamura | H01L 27/14601 345/84 |
| 2013/0094126 | A1* | 4/2013 | Rappoport | G02B 5/208 361/679.01 |

\* cited by examiner

*Primary Examiner* — Nicholas G Giles
(74) *Attorney, Agent, or Firm* — The Small Patent Law Group LLC; Dean D. Small

(57) ABSTRACT

A device, method and computer program product are provided. The device includes a housing having display and back surfaces. A digital camera unit (DCU) is held in the housing and is oriented to face the display surface. The DCU includes sensor pixels to capture image data for a scene in a field of view of the DCU. The sensor pixels are arranged in a sensor matrix with a sensor pixel density. A display layer is held in the housing proximate to the display surface. The display layer includes display pixels arranged in a display matrix having a first pixel density. The display pixels are separated by gaps arranged in rows and columns. The display layer overlays the DCU such that a first subset of the sensor pixels aligns with, and are covered by, the display pixels and a second subset of the sensor pixels align with, and are exposed through, the gaps between the display pixels. The device includes a processor and memory storing program instructions accessible by the processor. Responsive to execution of the program instructions, the processor performs graphical user interface (GUI) related operations to display content on the display layer and performs an image capture operation to obtain image data utilizing the DCU.

18 Claims, 7 Drawing Sheets

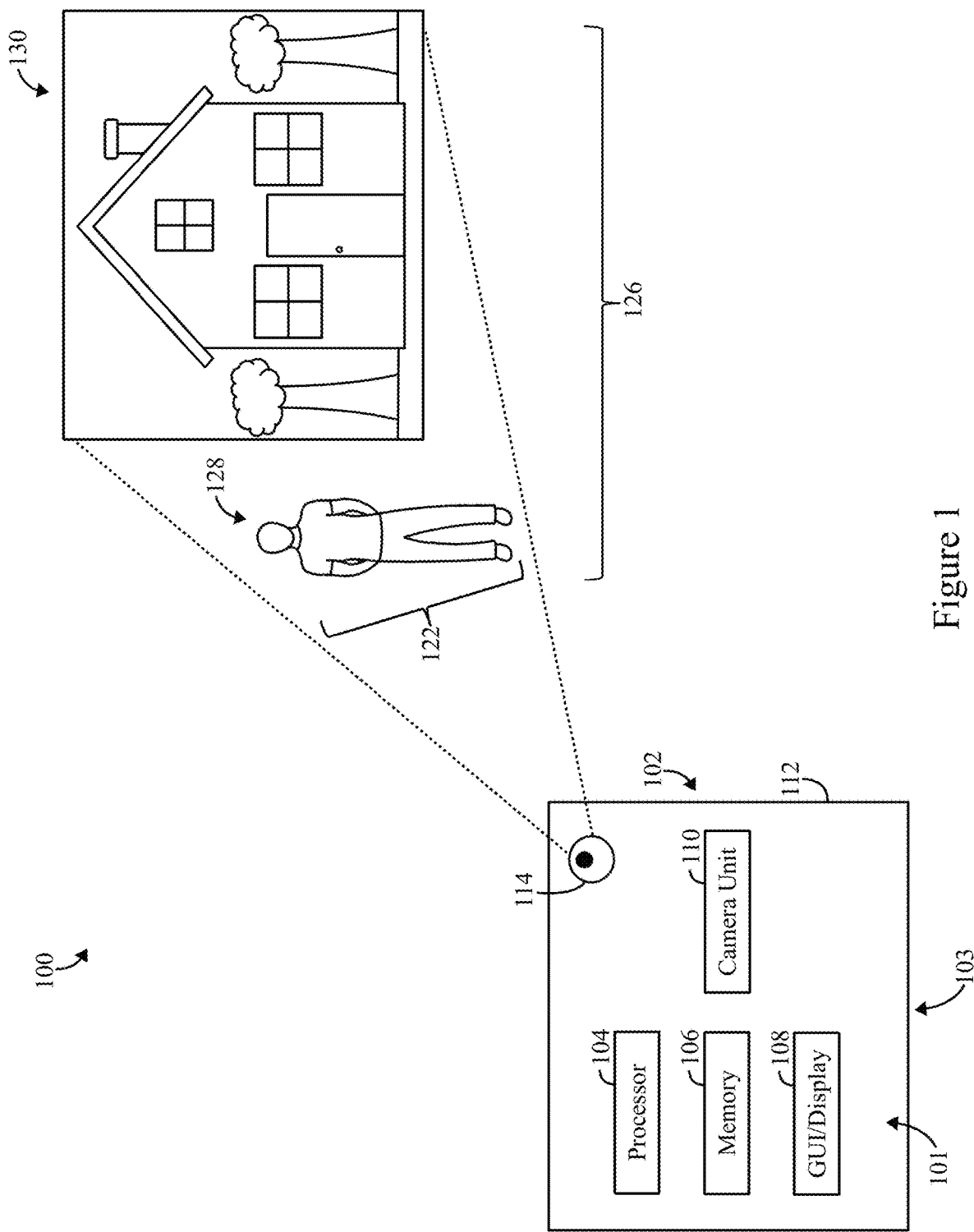

DEVICE HAVING A CAMERA OVERLAID BY DISPLAY AND METHOD FOR IMPLEMENTING SAME

RELATED APPLICATION

The following application relates to and is expressly incorporated herein by reference in its entirety (hereafter referred to as "Co-Pending Related Applications"):

U.S. patent application Ser. No. 16/406,183, filed May 8, 2019, titled "DEVICE HAVING A CAMERA OVERLAID BY DISPLAY AND METHOD FOR IMPLEMENTING THE SAME".

FIELD

The present disclosure relates generally to implementing a camera behind a display of a device.

BACKGROUND OF THE INVENTION

Common smartphones, tablets, laptop computers, and other mobile electronic devices include both a display surface and a front-facing camera on the front side of the device. Display technologies employed in these mobile electronic devices include liquid-crystal display (LCD) or active-matrix organic light-emitting diode (AMOLED). Typically, the display surface does not occupy the full front side of the mobile electronic device because a bezel, border, or notch is required to accommodate the lens of the front-facing camera. As a result, the size of the display surface is reduced. Given the limited area of the front surface of mobile electronic devices, it is desirable to eliminate any bezels, borders, or notches to increase the display area.

A front-facing camera of a mobile electronic device may be used for taking self-portraits and for video calls, as well as other applications. Front-facing cameras continue to increase in resolution to increase the quality of images and videos captured thereby. Therefore, it is desirable, among other things, for front facing cameras to have high quality and a good light path.

One proposed solution to increase the display area is to place the front-facing camera behind the display surface of the mobile electronic device. However, depending on the display technology employed in the mobile electronic device, pixel and subpixel arrangements necessary to operate the display screen can obstruct the light path of the underlying camera lens or sensor, resulting in degraded image quality of images captured by the camera. Accordingly, a need exists for improved devices and methods to implement cameras and/or sensors positioned behind the display layer.

SUMMARY

In accordance with embodiments herein, a device is provided. The device includes a housing having display and back surfaces. A digital camera unit (DCU) is held in the housing and is oriented to face the display surface. The DCU includes sensor pixels to capture image data for a scene in a field of view of the DCU. The sensor pixels are arranged in a sensor matrix with a sensor pixel density. A display layer is held in the housing proximate to the display surface. The display layer includes display pixels arranged in a display matrix having a first pixel density. The display pixels are separated by gaps arranged in rows and columns. The display layer overlays the DCU such that a first subset of the sensor pixels aligns with, and are covered by, the display pixels and a second subset of the sensor pixels align with, and are exposed through, the gaps between the display pixels. The device includes a processor and memory storing program instructions accessible by the processor. Responsive to execution of the program instructions, the processor performs graphical user interface (GUI) related operations to display content on the display layer and performs an image capture operation to obtain image data utilizing the DCU.

Optionally, during the image capture operation, the first subset of sensor pixels blocked, by the display pixels, may not capture the image data for the scene. During the image capture operation, the second subset of sensor pixels may capture the image data for a portion of the scene visible to the second subset through the gaps. The image data may represent vertical and horizontal strips of the scene corresponding to the rows and columns of the gaps. The sensor matrix may include a third subset of sensor pixels that may be partially covered by the display pixels and partially exposed through the gaps. The third subset of pixels may capture the image data for a portion of the scene visible to the third subset through the gaps. The display pixels may comprise a grid of subpixel color elements with the gaps arranged in the rows and columns between the subpixel color elements.

Optionally, the sensor pixel density may be at least twice the first pixel density of the display matrix. The gaps may include a first row that overlays and exposes at least two rows of the sensor pixels and may include a first column that overlays and exposes at least two columns of the sensor pixels. The display matrix may have the first pixel density in a region overlaying the DCU and may have a second pixel density in a region that does not overlay any DCU. The first pixel density of the display matrix may be less than the second pixel density of the display matrix. The display matrix may comprise a first arrangement of display pixels in a region overlaying the DCU and a second arrangement of display pixels in a region that may not overlay any DCU. The first arrangement may be different from the second arrangement.

In accordance with embodiments herein, a computer implemented method is provided. The method is under control of one or more processors and is configured with specific executable program instructions. The method captures image data for a scene in a field of view of a digital camera unit (DCU). The DCU is located below a display layer of an electronic device and is oriented to face the display surface. The DCU includes sensor pixels to capture image data for a scene. The sensor pixels are arranged in a sensor matrix with a sensor pixel density. The method displays content on the display layer of the electronic device. The display layer includes display pixels arranged in a display matrix having a first pixel density. The display pixels are separated by gaps arranged in rows and columns. The display layer overlays the DCU, such that a first subset of the sensor pixels aligns with, and are covered by, the display pixels and a second subset of the sensor pixels align with, and are exposed through, the gaps between the display pixels.

Optionally, during capturing, the first subset of sensor pixels blocked, by the display pixels, may not capture the image data for the scene. During capturing, the second subset of sensor pixels may capture the image data for a portion of the scene visible to the second subset through the gaps. The image data may represent vertical and horizontal strips of the scene corresponding to the rows and columns of the gaps. The sensor matrix may include a third subset of sensor pixels that may be partially covered by the display pixels and partially exposed through the gaps. During capturing, the third subset of pixels may capture the image data for a portion of the scene visible to the third subset through the gaps. The sensor pixel density may be at least twice the first pixel density of the display matrix. During capturing, the gaps may include a first row that overlays and exposes at least two rows of the sensor pixels and may include a first column that overlays and exposes at least two columns of the sensor pixels.

In accordance with embodiments herein, a computer program product is provided. The computer program product includes a non-signal computer readable storage medium comprising computer executable code to capture image data for a scene for a scene in a field of view of a digital camera unit (DCU). The DCU is located below a display layer of an electronic device and oriented to face the display surface. The DCU includes sensor pixels to capture image data for a scene, the sensor pixels arranged in a sensor matrix with a sensor pixel density. The product displays content on the display layer of the electronic device. The display layer includes display pixels arranged in a display matrix having a first pixel density. The display pixels are separated by gaps arranged in rows and columns. The display layer overlays the DCU, such that a first subset of the sensor pixels aligns with, and are covered by, the display pixels and a second subset of the sensor pixels align with, and are exposed through, the gaps between the display pixels.

Optionally, during the capture, the computer executable code may not capture image data for the scene. The first subset of sensor pixels may be blocked by the display pixels. During the capture, the computer executable code may capture image data for a portion of the scene visible to the second subset of sensor pixels through the gaps between the display pixels. The image data may represent vertical and horizontal strips of the scene corresponding to the rows and columns of the gaps. The sensor matrix may include a third subset of sensor pixels that are partially covered by the display pixels and partially exposed through the gaps. During the capture, the third subset of pixels may capture the image data for a portion of the scene visible to the third subset through the gaps.

BRIEF DESCRIPTION OF THE DRAWINGS

FIG. 1 illustrates a system for implementing a camera behind a display of a device in accordance with embodiments herein.

DETAILED DESCRIPTION

Figure 2A:
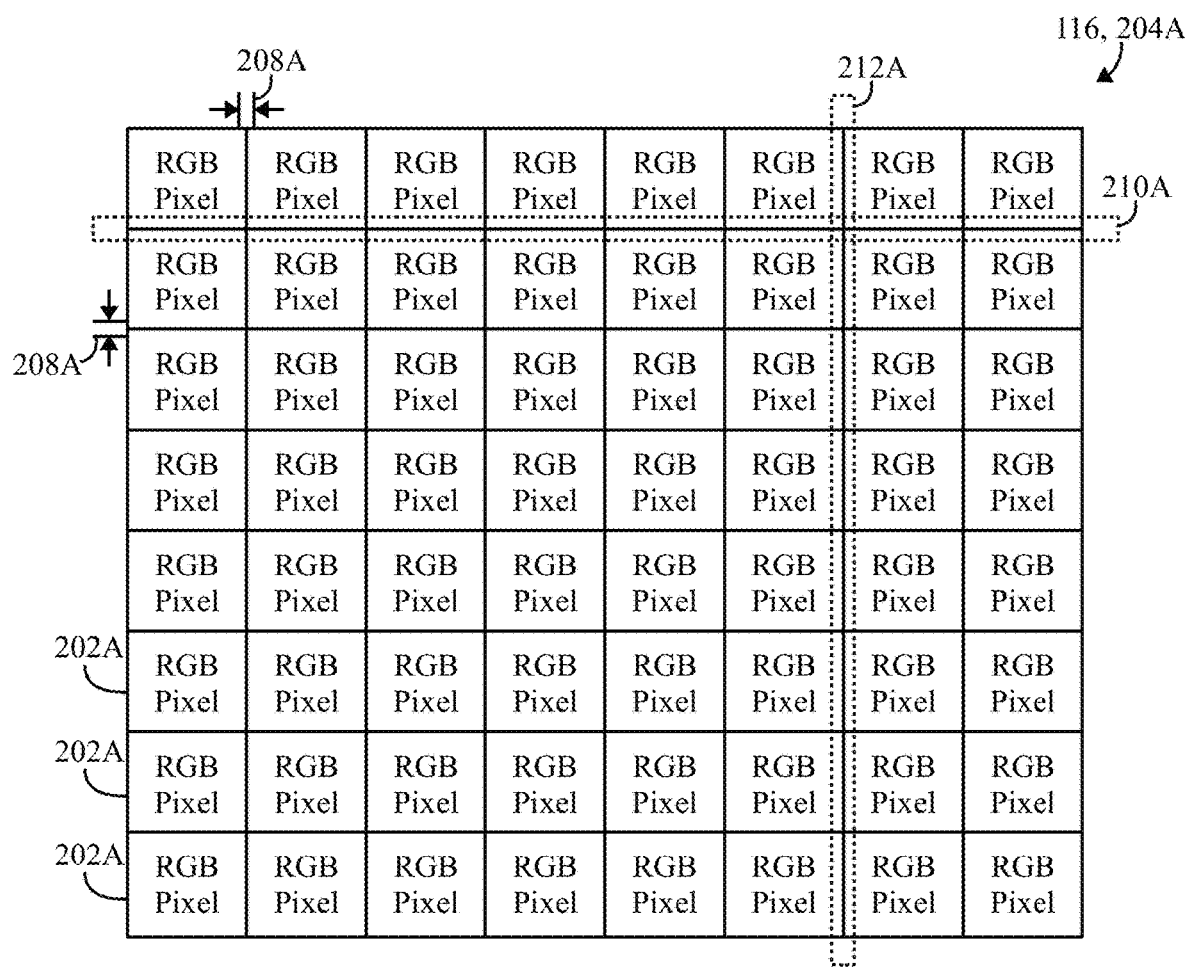
FIG. 2A illustrates one exemplary display layer in accordance with embodiments herein.

It will be readily understood that the components of the embodiments as generally described and illustrated in the figures herein, may be arranged and designed in a wide variety of different configurations in addition to the described example embodiments. Thus, the following more detailed description of the example embodiments, as represented in the figures, is not intended to limit the scope of the embodiments, as claimed, but is merely representative of example embodiments.

Reference throughout this specification to "one embodiment" or "an embodiment" (or the like) means that a particular feature, structure, or characteristic described in connection with the embodiment is included in at least one embodiment. Thus, appearances of the phrases "in one embodiment" or "in an embodiment" or the like in various places throughout this specification are not necessarily all referring to the same embodiment.

Furthermore, the described features, structures, or characteristics may be combined in any suitable manner in one or more embodiments. In the following description, numerous specific details are provided to give a thorough understanding of embodiments. One skilled in the relevant art will recognize, however, that the various embodiments can be practiced without one or more of the specific details, or with other methods, components, materials, etc. In other instances, well-known structures, materials, or operations are not shown or described in detail to avoid obfuscation. The following description is intended only by way of example, and simply illustrates certain example embodiments.

Terms

The term "blind region" shall mean a region of a scene in a field of view of a camera and/or sensor pixels that is blocked by the display pixels of a display layer overlaying the camera and/or sensor pixels and is not visible to the camera and/or sensor pixels.

The term "visible region" shall mean a region of a scene in a field of view of a camera and/or sensor pixels that is not blocked by the display pixels of a display layer overlaying the camera and/or sensor pixels and is visible to the camera and/or sensor pixels.

The term "visible", when describing a region of scene in a field of view in connection with a portion of the camera and/or sensor pixels, shall mean that the portion of the camera and/or sensor pixels have a clear line of site to the region of the scene that is not blocked by display pixels.

The term "partially visible", when describing a region of scene in connection with a portion of the camera and/or sensor pixels, shall mean that the portion of the camera and/or sensor pixels have a partially clear line of site to the region of the scene that is not blocked by display pixels and a partially blocked line of site that is blocked by display pixels.

The term "succession" shall mean occurring one after another within a very short period of time, such as a few milliseconds between consecutive frames.

The term "image data" shall mean data associated with one or more of two-dimensional (2-D) images, three-dimensional (3-D) images, panoramic images, still images, and/or video images.

The term "degree of light capture" shall mean the amount, level, or extent to which one or more of a camera, a sensor, a sensor matrix, and sensor pixels capture light through one or more of a display, a display layer, display pixels, or subpixel color elements as compared to light capture absent any obstruction.

System Overview

FIG. 1 illustrates a system 100 implementing a camera behind a display of an electronic device 102 in accordance with embodiments herein. The system 100 may be implemented in connection with devices having cameras and/or sensors positioned behind the display surface or layer of the electronic device. For example, electronic devices having bezel-less and/or notch-less display surfaces may include front-facing cameras and/or sensors placed behind the device display surface. Embodiments herein avoid certain difficulties in implementing cameras and/or sensors positioned behind the display layer of electronic devices, such as difficulties arising from the degradation of light capture of the camera and/or sensor due to elements of the display layer positioned between the camera and/or sensor and the scene.

The system 100 includes a device 102 that may be stationary or portable/handheld. The device 102 includes, among other things, a processor 104, local storage medium 106, and a user interface (including a display) 108. The device 102 also includes a digital camera unit (DCU) 110.

The device 102 includes a housing 112 that holds the processor 104, local storage medium 106, user interface 108, display layer 116 (shown in FIG. 2A), and DCU 110. The housing 112 includes a display surface 101 and a back surface 103. A display layer 116 is positioned within in the housing 112 proximate to the display surface 101. The DCU 110 is oriented within the housing so a sensor 114 (or lens) of the DCU 110 faces the display surface 101. The display layer 116 lies between the display surface 101 and the sensor 114 of the DCU 110. The DCU 110, via the sensor 114, has a field of view 122 and operates under control of the processor 104 in order to capture image data for a scene 126 in the field of view 122. The DCU 110 includes sensor pixels to capture image data for the scene 126 in the field of view 122 of sensor 114 of the DCU. The sensor pixels are arranged into a sensor matrix having a sensor resolution and a sensor pixel density.

As illustrated in FIG. 2A, the display layer 116 includes display pixels 202A arranged into a display matrix 204A. The display matrix 204A has at least a first resolution. The display pixels 202A are separated by gaps 208A. In one example, the display pixels are separated by gaps 208A arranged into rows 210A and columns 212A.

Figure 2B:
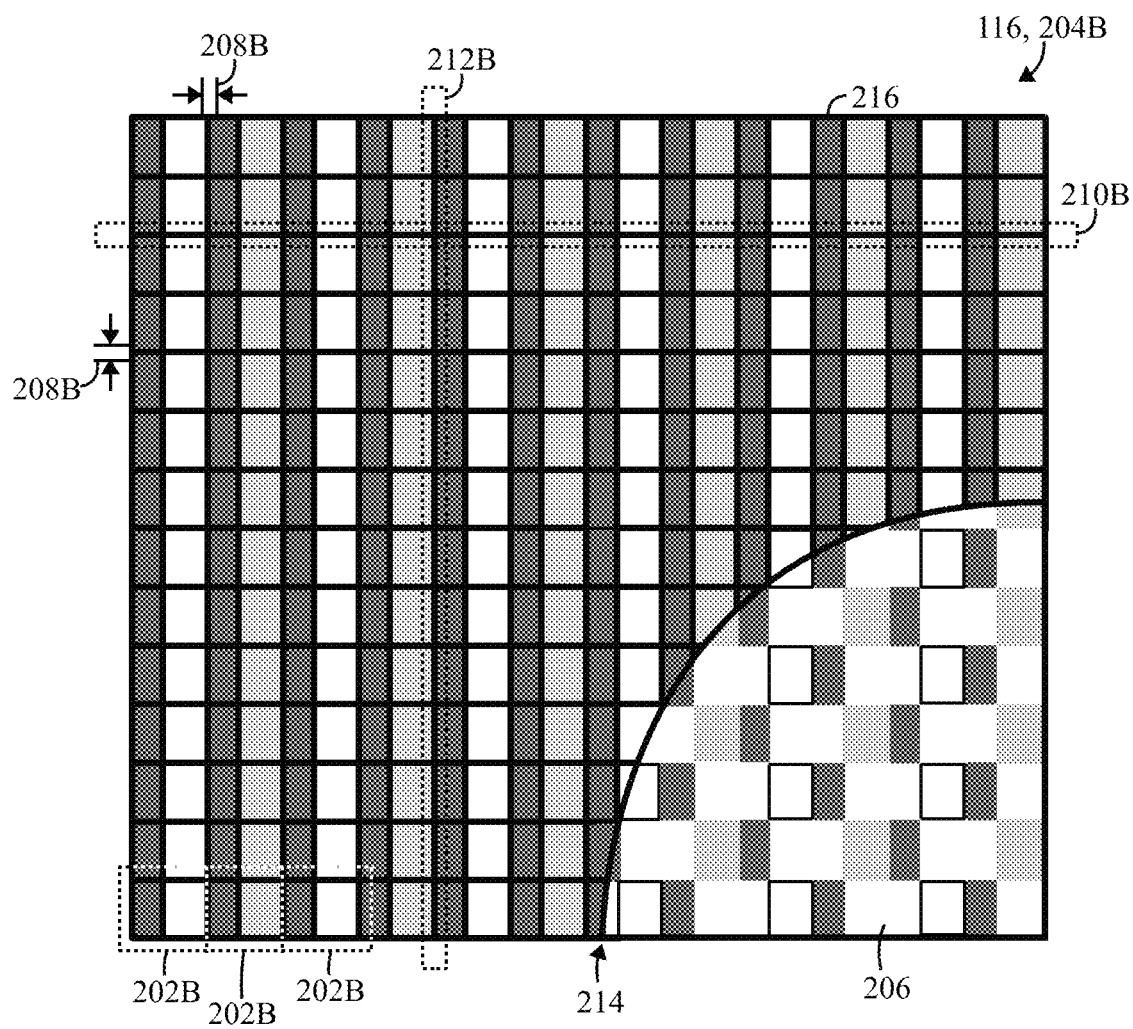
FIG. 2B illustrates another exemplary display layer in accordance with embodiments herein.

Additionally or alternatively, as illustrated in FIG. 2B, the display layer 116 includes display subpixel color elements 202B arranged in a display matrix 204B. The display matrix 204B has at least a first resolution. The display subpixel color elements 202B are separated by gaps 208B. In one example, the display subpixel color elements are separated by gaps 208B arranged into rows 210B and columns 212B. Each display subpixel color element 202B may include red, green, blue, yellow, white, or a like color primary. A plurality of subpixel color elements 202B cooperate to form a pixel, such as one of display pixels 202A in FIG. 2A. In an example, display matrix 204B may be the subpixel color element equivalent of display matrix 204A.

For the sake of clarity, unless context clearly dictates otherwise, pixels 202 refers to both display pixels 202A and display subpixel color elements 202B, display matrix 204 refers to both display matrix 204A and display matrix 204B, gaps 208 refers to both gaps 208A and gaps 208B, rows 210 refers to both rows 210A and rows 210B, and columns 212 refers to both columns 212A and columns 212B.

At least a portion of the display layer 116 overlays the DCU 110 such that a first subset of the sensor pixels of the sensor matrix align with, and are covered by, the display pixels 202 and a second subset of the sensor pixels of the sensor matrix align with, and are exposed through, the gaps 208 between the display pixels 202. The gaps 208 may include at least a first row that overlays and exposes at least two rows of the sensor pixels and may include a first column that overlays and exposes at least two columns of the sensor pixels. Optionally, a third subset of the sensor pixels of the sensor matrix may be partially covered by the display pixels and partially exposed through the gaps 208 between the display pixels 202. In an example, the sensor pixel density may be at least twice the first pixel density of the display matrix 204. In an additional or alternative example, the portion of the display layer 116 that overlays the DCU 110 has one or more of a reduced pixel density, a select number and arrangement of missing pixels (e.g., every other pixel missing), as compared to portions of the display layer 116 that do not overlay the DCU 110.

During an image capture operation, the first subset of sensor pixels, blocked by the display pixels 202, do not capture the image data for the scene 126 and the second subset of sensor pixels capture the image data for a portion of the scene visible to the second subset through the gaps 208. Optionally, the third subset of sensor pixels, being only partially covered by the display pixels 202, capture the image data for a portion of the scene visible to the third subset through the gaps 208. In one example, when the display pixels are separated by gaps 208 arranged into rows 210 and columns 212, the image data represents the vertical and horizontal strips of the scene corresponding to the rows 210 and columns 212. Portions of the scene that are visible are referred to as a visible region while portions of a scene that are blocked by the display pixels are referred to as a blind region.

Figure 2C:
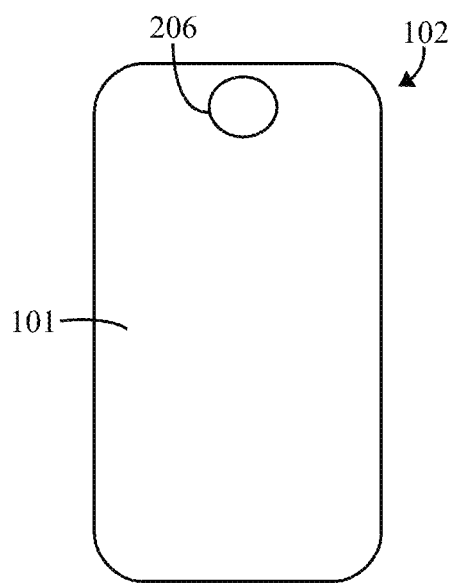
FIG. 2C illustrates another exemplary display layer in accordance with embodiments herein.

In accordance with embodiments herein, the display matrix 204 may have the first pixel density in a first region 206 of the display layer 116 overlaying the sensor 114 of the DCU 110 (the outline of the sensor 114 represented by dotted line 214) and may have a second pixel density in a second region 216 that does not overlay any DCU. In one example, the second pixel density corresponds to a device display pixel density representing the full visual quality of the display layer 116 and the first pixel density is less than the second pixel density. As illustrated by FIG. 2C, changing (e.g., reducing) the pixel density of the first region 206, the degree of light capture of the DCU 110 can be managed (e.g., increased) for a DCU 110 placed behind the display layer 116 during an image capture operation. For example, the device display pixel density for a conventional display area (corresponding to the second region 216) may be the pixel density of a 500 ppi display layer and the first pixel density of the first region 206 (corresponding to a relatively small DCU sensor 114 overlay area) may have 50% of the device display pixel density of the second region 216. Accordingly, a DCU 110 placed behind the display layer 116 may not be visually noticeable to a user and the degree of light capture of the DCU 110 managed (e.g., increased) to capture image data having sufficient quality.

Additionally or alternatively, the display matrix 204 may have a first arrangement of display pixels 202 in the first region 206 and a second arrangement of display pixels 202 in the second region 216, the first arrangement being different from the second arrangement. Analogous to the example above, the second arrangement of display pixels 202 may provide a device display quality for a conventional display area (corresponding to the second region 216). However, the first arrangement of display pixels 202 may provide a reduced device display quality for the first region 206, but that manages (e.g., increases) the degree of light capture of the DCU to ultimately produce images having sufficient quality.

Image Capture Device

Figure 3:
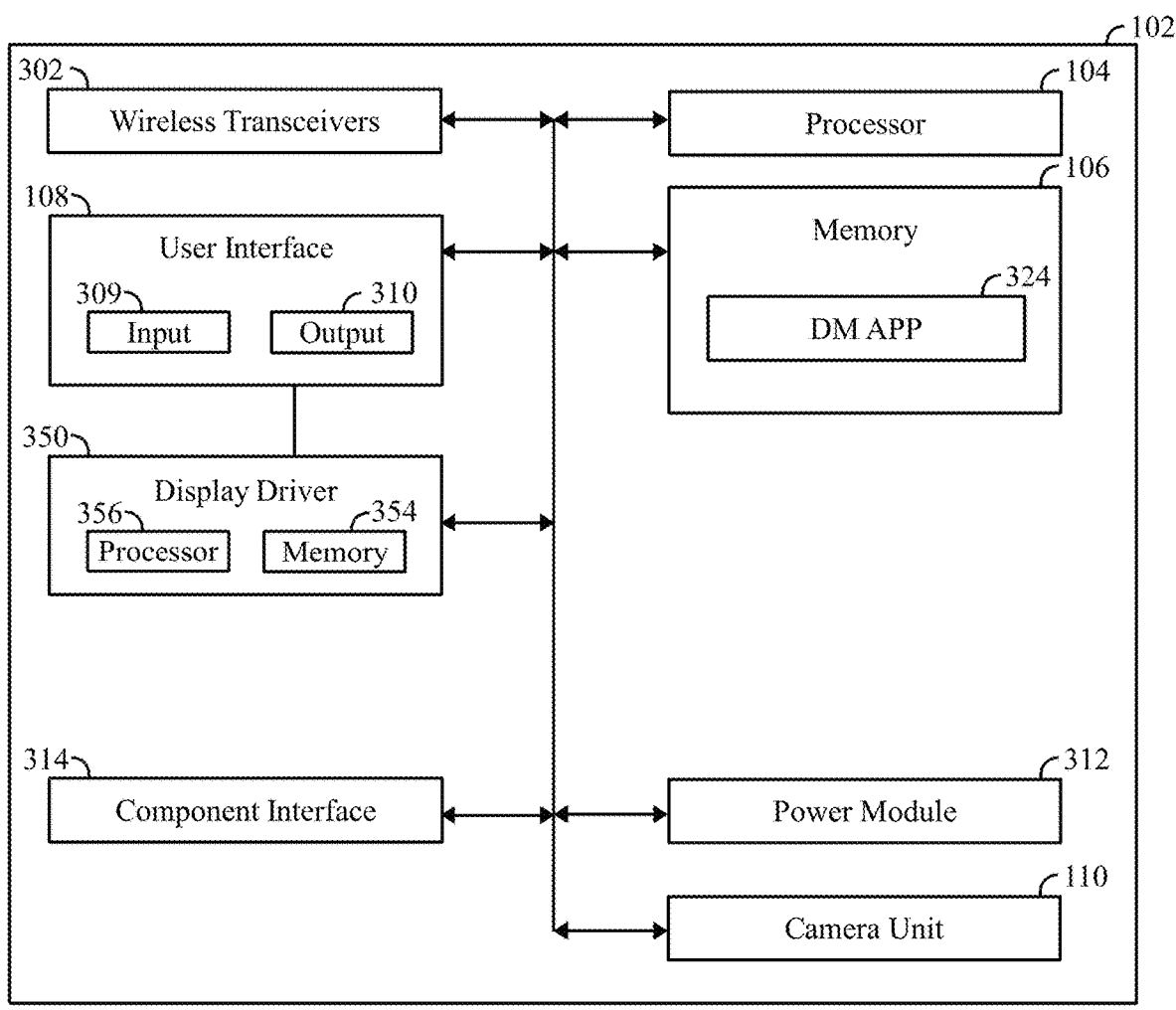
FIG. 3 illustrates a simplified block diagram of the electronic device of FIG. 1 in accordance with an embodiment.

FIG. 3 illustrates a simplified block diagram of the electronic device 102 of FIG. 1 in accordance with an embodiment. The electronic device 102 includes components such as one or more wireless transceivers 302, one or more processors 104 (e.g., a microprocessor, microcomputer, application-specific integrated circuit, etc.), one or more local storage medium (also referred to as a memory portion) 106, the user interface 108 which includes one or more input devices 309 and one or more output devices 310, a power module 312, and a component interface 314. The device 102 also includes the DCU 110. All of these components can be operatively coupled to one another, and can be in communication with one another, by way of one or more internal communication links, such as an internal bus.

The input and output devices 309, 310 may each include a variety of visual, audio, and/or mechanical devices. For example, the input devices 309 can include a visual input device such as an optical sensor or camera, an audio input device such as a microphone, and a mechanical input device such as a keyboard, keypad, selection hard and/or soft buttons, switch, touchpad, touch screen, icons on a touch screen, a touch sensitive areas on a touch sensitive screen and/or any combination thereof. Similarly, the output devices 310 can include a visual output device such as a liquid crystal display screen, one or more light emitting diode indicators, an audio output device such as a speaker, alarm and/or buzzer, and a mechanical output device such as a vibrating mechanism. The display may be touch sensitive to various types of touch and gestures. The display can be operably coupled to a display driver 350. The display driver 350 may further include dedicated memory 354 and a dedicated processor 356. As further examples, the output device(s) 310 may include a touch sensitive screen, a non-touch sensitive screen, a text-only display, a smart phone display, an audio output (e.g., a speaker or headphone jack), and/or any combination thereof.

The user interface 108 permits the user to select one or more of a switch, button or icon to collect content elements, and/or enter indicators to direct the DCU 110 to take a photo or video (e.g., capture image data for the scene 126). As another example, the user may select a content collection button on the user interface two or more successive times, thereby instructing the electronic device 102 to capture the image data.

As another example, the user may enter one or more predefined touch gestures and/or voice command through a microphone on the electronic device 102. The predefined touch gestures and/or voice command may instruct the electronic device 102 to collect image data for a scene and/or a select object (e.g., the person 128 and/or the house 130) in the scene.

The local storage medium 106 can encompass one or more memory devices of any of a variety of forms (e.g., read only memory, random access memory, static random access memory, dynamic random access memory, etc.) and can be used by the processor 104 to store and retrieve data. The data that is stored by the local storage medium 106 can include, but need not be limited to, operating systems, applications, user collected content and informational data. Each operating system includes executable code that controls basic functions of the device, such as interaction among the various components, communication with external devices via the wireless transceivers 302 and/or the component interface 314, and storage and retrieval of applications and data to and from the local storage medium 106. Each application includes executable code that utilizes an operating system to provide more specific functionality for the communication devices, such as file system service and handling of protected and unprotected data stored in the local storage medium 106.

Additionally, the applications stored in the local storage medium 106 include an image data application 324 for facilitating the management and operation of the electronic device 102 in order to allow a user to read, create, edit, delete, organize or otherwise manage the image data, and the like. The image data application 324 includes program instructions accessible by the one or more processors 104 to direct a processor 104 to implement the methods, processes and operations described herein including, but not limited to the methods, processes and operations illustrated in the Figures and described in connection with the Figures.

Other applications stored in the local storage medium 106 include various application program interfaces (APIs), some of which provide links to/from, e.g., a cloud hosting service or the like. The power module 312 preferably includes a power supply, such as a battery, for providing power to the other components while enabling the electronic device 102 to be portable, as well as circuitry providing for the battery to be recharged. The component interface 314 provides a direct connection to other devices, auxiliary components, or accessories for additional or enhanced functionality, and in particular, can include a USB port for linking to a user device with a USB cable.

Each transceiver 302 can utilize a known wireless technology for communication. Exemplary operation of the wireless transceivers 302 in conjunction with other components of the electronic device 102 may take a variety of forms and may include, for example, operation in which, upon reception of wireless signals, the components of electronic device 102 detect communication signals and the transceiver 302 demodulates the communication signals to recover incoming information, such as voice and/or data, transmitted by the wireless signals. After receiving the incoming information from the transceiver 302, the processor 104 formats the incoming information for the one or more output devices 310. Likewise, for transmission of wireless signals, the processor 104 formats outgoing information, which may or may not be activated by the input devices 309, and conveys the outgoing information to one or more of the wireless transceivers 302 for modulation to communication signals. The wireless transceiver(s) 302 convey the modulated signals to a remote device, such as a cell tower or a remote server (not shown).

Digital Camera Module

Figure 4:
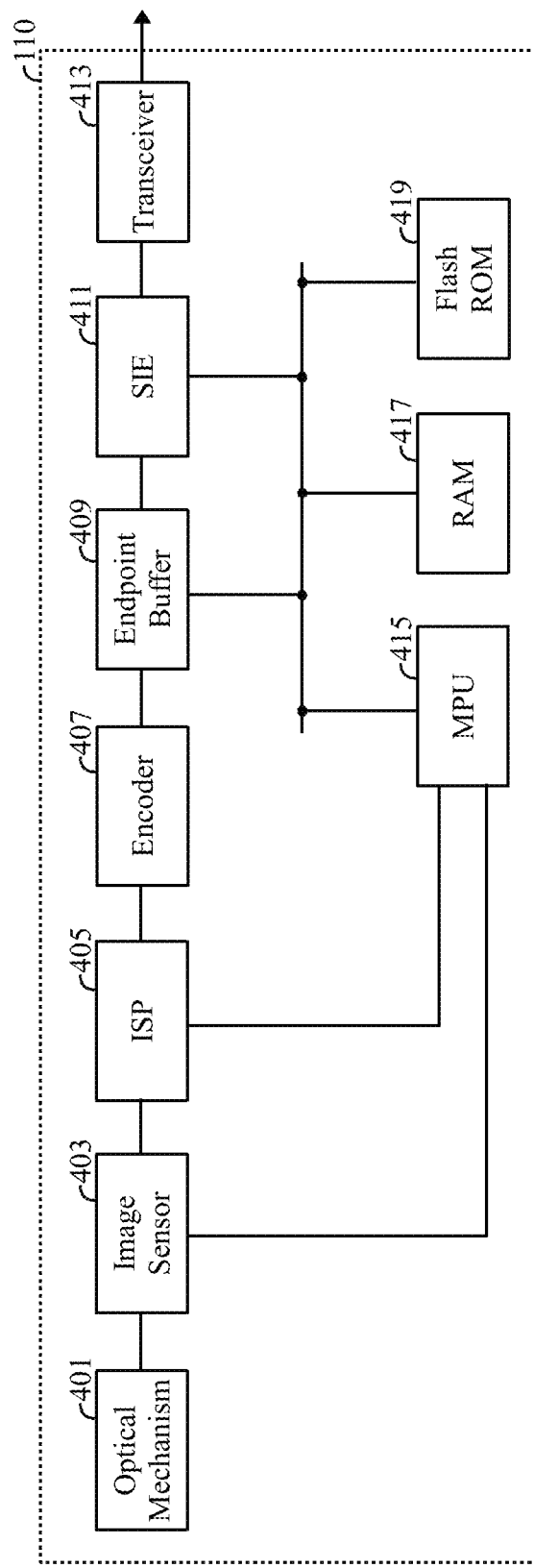
FIG. 4 illustrates a functional block diagram illustrating a schematic configuration of one example of a digital camera unit in accordance with embodiments herein.

FIG. 4 is a functional block diagram illustrating a schematic configuration of one example of a digital camera unit (DCU) 110. The DCU 110 is able to transfer VGA, QVGA, WVGA, WQVGA, and other image data in the static image transfer mode. An optical mechanism 401 (corresponding to sensor 114 in FIG. 1) includes an optical sensor and an optical filter and provides an image of a subject on an image sensor 403.

The image sensor 403 includes a CMOS image sensor that converts electric charges, which correspond to the amount of light accumulated in photo diodes forming pixels, to electric signals and outputs the electric signals. The image sensor 403 further includes a CDS circuit that suppresses noise, an AGC circuit that adjusts gain, an AD converter circuit that converts an analog signal to a digital signal, and the like. The image sensor 403 outputs digital signals corresponding to the image of the subject. The image sensor 403 is able to generate image data at a select frame rate (e.g., 30 fps).

The CMOS image sensor is provided with an electronic shutter referred to as a "rolling shutter." The rolling shutter controls exposure time so as to be optimal for a photographing environment with one or several lines as one block. In one frame period, or in the case of an interlace scan, the rolling shutter resets signal charges that have accumulated in the photo diodes, and which form the pixels during one field period, in the middle of photographing to control the time period during which light is accumulated corresponding to shutter speed. In the image sensor 403, a CCD image sensor may be used, instead of the CMOS image sensor.

An image signal processor (ISP) 405 is an image signal processing circuit which performs correction processing for correcting pixel defects and shading, white balance processing for correcting spectral characteristics of the image sensor 403 in tune with the human luminosity factor, interpolation processing for outputting general RGB data on the basis of signals in an RGB Bayer array, color correction processing for bringing the spectral characteristics of a color filter of the image sensor 403 close to ideal characteristics, and the like. The ISP 405 further performs contour correction processing for increasing the resolution feeling of a subject, gamma processing for correcting nonlinear input-output characteristics of the LCD, and the like. Optionally, the ISP 405 may perform the processing discussed herein to utilize additional sensed data with the image data to form image data sets. The ISP 405 may then store the image data sets in the RAM 417, flash ROM 419 and elsewhere.

Optionally, additional features may be provided within the DCU 110, such as described hereafter in connection with the encoder 407, endpoint buffer 409, SIE 411, transceiver 413 and micro-processing unit (MPU) 415. Optionally, the encoder 407, endpoint buffer 409, serial interface engine (SIE) 411, transceiver 413 and MPU 415 may be omitted entirely.

In accordance with certain embodiments, an encoder 407 is provided to compress image data received from the ISP 405. An endpoint buffer 409 forms a plurality of pipes for transferring data by temporarily storing data to be transferred bidirectionally to or from the system. A SIE) 411 packetizes the image data received from the endpoint buffer 409 so as to be compatible with the USB standard and sends the packet to a transceiver 413 or analyzes the packet received from the transceiver 413 and sends a payload to an MPU 415. When the USB bus is in the idle state for a predetermined period of time or longer, the SIE 411 interrupts the MPU 415 in order to transition to a suspend state. The SIE 411 activates the suspended MPU 415 when the USB bus has resumed.

The transceiver 413 includes a transmitting transceiver and a receiving transceiver for communication (e.g., USB, MIDI, and the like). The MPU 415 runs enumeration for communication transfer and controls the operation of the DCU 110 in order to perform photographing and to transfer image data. The DCU 110 conforms to power management prescribed in the corresponding communication standard. When being interrupted by the SIE 411, the MPU 415 halts the internal clock and then makes the DCU 110 transition to the suspend state as well as itself.

When the communication bus has resumed, the MPU 415 returns the DCU 110 to the power-on state or the photographing state. The MPU 415 interprets the command received from the system and controls the operations of the respective units so as to transfer the image data in the dynamic image transfer mode or the static image transfer mode. When starting the transfer of the image data in the static image transfer mode, the MPU 415 first performs the calibration of rolling shutter exposure time (exposure amount), white balance, and the gain of the AGC circuit and then acquires optimal parameter values for the photographing environment at the time, before setting the parameter values to predetermined registers for the image sensor 403 and the ISP 405.

The MPU 415 performs the calibration of exposure time by calculating the average value of luminance signals in a photometric selection area on the basis of output signals of the CMOS image sensor and adjusting the parameter values so that the calculated luminance signal coincides with a target level. The MPU 415 also adjusts the gain of the AGC circuit when calibrating the exposure time. The MPU 415 performs the calibration of white balance by adjusting the balance of an RGB signal relative to a white subject that changes according to the color temperature of the subject.

When the image data is transferred in the dynamic image transfer mode, the camera unit does not transition to the suspend state during a transfer period. Therefore, the parameter values once set to registers do not disappear. In addition, when transferring the image data in the dynamic image transfer mode, the MPU 415 appropriately performs calibration even during photographing to update the parameter values of the image data.

When receiving an instruction of calibration, the MPU 415 performs calibration and sets new parameter values before an immediate data transfer and sends the parameter values to the system.

The DCU 110 is a bus-powered device that operates with power supplied from the USB bus. Note that, however, the DCU 110 may be a self-powered device that operates with its own power. In the case of the self-powered device, the MPU 415 controls the self-supplied power to follow the state of the USB bus 50.

Image Data Capture Process

Figure 5:
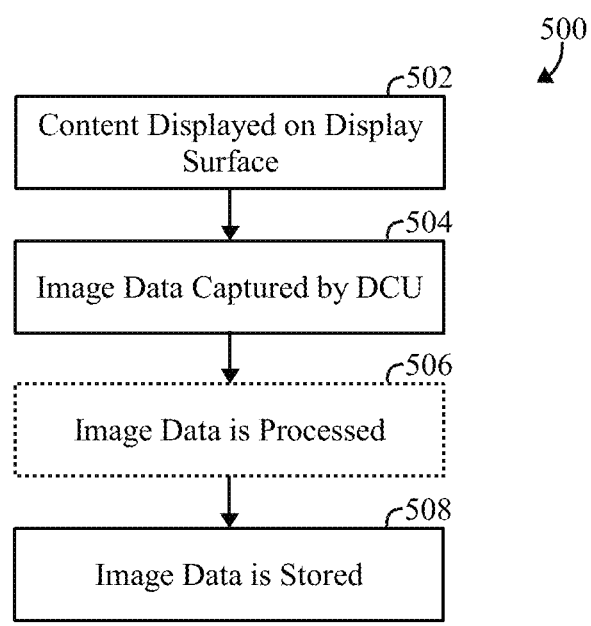
FIG. 5 illustrates a process for capturing images at a camera behind the display of a device in accordance with embodiments herein.

FIG. 5 illustrates a process for generating image data sets in accordance with embodiments herein. The operations of FIG. 5 are carried out by one or more processors in FIGS. 1, 3, and 4 in response to execution of program instructions, such as in the image data application 324, and/or other applications stored in the local storage medium 106 and/or the main local storage medium 313. Optionally, all or a portion of the operations of FIG. 5 may be carried out without program instructions, such as in an image signal processor that has the corresponding operations implemented in silicon gates and other hardware. It should be recognized that while the operations of method 500 are described in a somewhat serial manner, one or more of the operations of method 500 may be continuous and/or performed in parallel with one another and/or other operations of the electronic device 102.

At 502, content is displayed on the display surface 101 of the electronic device 102 via the display layer 116. The display layer 116 is positioned proximate the display layer 116. The display layer 116 includes display pixels 202 arranged into a display matrix 204. The display pixels 202 are separated by gaps 208. In one example, the display pixels 202 are separated by gaps 208 arranged into rows 210 and columns 212. The display matrix 204 may be divided into a first region 206 corresponding to an area of the display layer 116 that overlays the DCU sensor 114 and a second region 216 that does not overlay any DCU sensor 114. The first region 206 may be very small compared to the second region 216. For example, the first region 206 may correspond to a DCU sensor 114 having a 4 mm radius and the second region 216 may correspond to the display surface of a typical smartphone. Either or both of the pixel density of the display matrix 204 and the pixel arrangement of the display matrix 204 of the second region 216 represents the full visual quality of the display layer 116. The first region 206 includes one or more of a different pixel density (e.g., reduced) of the display matrix 204 or a different pixel arrangement of the display matrix 204 from the second region 216 that may be used to manage the degree of light capture of the DCU 110. For example, the first region 206 may have a pixel density that is 50% of the pixel density of the second region 216. Reducing the pixel density of the first region 206 may increase the light transmission to the DCU sensor 114, thereby increasing the quality of image data.

At 504, image data is captured by the DCU 110 of the electronic device 102 for a scene of interest. The image data may include photographs and/or video recordings captured by the DCU 110 under user control. For example, a user may direct the DCU sensor 114 toward a scene 126 and enter a command at the user interface 108 directing the camera unit 110 to take a photo. The DCU includes sensor pixels arranged into a sensor matrix. The sensor matrix may be characterized by one or more of a sensor resolution and a sensor pixel density. The sensor pixels capture image data for the scene.

During capture, the first subset of sensor pixels, being blocked by the display pixels 202 of the first region 206, do not capture the image data for the scene 126 and the second subset of sensor pixels capture the image data for a portion of the scene 126 visible to the second subset through the gaps 208. Optionally, the third subset of sensor pixels, being only partially covered by the display pixels 202, capture the image data for a portion of the scene 126 visible to the third subset through the gaps 208. In one example, during capture, the display pixels are separated by gaps 208 arranged into rows 210 and columns 212 and the captured image data represents the vertical and horizontal strips of the scene 126 corresponding to the rows 210 and columns 212. In an additional or alternative example, during capture, the gaps 208 include a first row 210 that overlays and exposes at least two rows of the sensor pixels and include a first column 212 that overlays and exposes at least two columns of the sensor pixels. In one example, the sensor pixel density is at least twice the first pixel density of the display matrix.

Optionally, at 506, the image data is processed to fill in the first subset of sensor pixels. Further optionally, the image data is processed to fill in the gaps for the portions of the scene not captured by the portion of the third subset through the gaps 208.

At 508, the image data corresponding to the scene 126 is stored in the local storage medium 106.

Conclusion

Before concluding, it is to be understood that although e.g., a software application for undertaking embodiments herein may be vended with a device such as the system 100, embodiments herein apply in instances where such an application is e.g., downloaded from a server to a device over a network such as the Internet. Furthermore, embodiments herein apply in instances where e.g., such an application is included on a computer readable storage medium that is being vended and/or provided, where the computer readable storage medium is not a carrier wave or a signal per se.

As will be appreciated by one skilled in the art, various aspects may be embodied as a system, method or computer (device) program product. Accordingly, aspects may take the form of an entirely hardware embodiment or an embodiment including hardware and software that may all generally be referred to herein as a "circuit," "module" or "system." Furthermore, aspects may take the form of a computer (device) program product embodied in one or more computer (device) readable storage medium(s) having computer (device) readable program code embodied thereon.

Any combination of one or more non-signal computer (device) readable medium(s) may be utilized. The non-signal medium may be a storage medium. A storage medium may be, for example, an electronic, magnetic, optical, electromagnetic, infrared, or semiconductor system, apparatus, or device, or any suitable combination of the foregoing. More specific examples of a storage medium would include the following: a portable computer diskette, a hard disk, a random access memory (RAM), a dynamic random access memory (DRAM), a read-only memory (ROM), an erasable programmable read-only memory (EPROM or Flash memory), a portable compact disc read-only memory (CD-ROM), an optical storage device, a magnetic storage device, or any suitable combination of the foregoing.

Program code for carrying out operations may be written in any combination of one or more programming languages. The program code may execute entirely on a single device, partly on a single device, as a stand-alone software package, partly on single device and partly on another device, or entirely on the other device. In some cases, the devices may be connected through any type of network, including a local area network (LAN) or a wide area network (WAN), or the connection may be made through other devices (for example, through the Internet using an Internet Service Provider) or through a hard wire connection, such as over a USB connection. For example, a server having a first processor, a network interface, and a storage device for storing code may store the program code for carrying out the operations and provide this code through its network interface via a network to a second device having a second processor for execution of the code on the second device.

The units/modules/applications herein may include any processor-based or microprocessor-based system including systems using microcontrollers, reduced instruction set computers (RISC), application specific integrated circuits (ASICs), field-programmable gate arrays (FPGAs), logic circuits, and any other circuit or processor capable of executing the functions described herein. Additionally or alternatively, the units/modules/controllers herein may represent circuit modules that may be implemented as hardware with associated instructions (for example, software stored on a tangible and non-transitory computer readable storage medium, such as a computer hard drive, ROM, RAM, or the like) that perform the operations described herein. The above examples are exemplary only, and are thus not intended to limit in any way the definition and/or meaning of the term "controller." The units/modules/applications herein may execute a set of instructions that are stored in one or more storage elements, in order to process data. The storage elements may also store data or other information as desired or needed. The storage element may be in the form of an information source or a physical memory element within the modules/controllers herein. The set of instructions may include various commands that instruct the units/modules/applications herein to perform specific operations such as the methods and processes of the various embodiments of the subject matter described herein. The set of instructions may be in the form of a software program. The software may be in various forms such as system software or application software. Further, the software may be in the form of a collection of separate programs or modules, a program module within a larger program or a portion of a program module. The software also may include modular programming in the form of object-oriented programming.

The processing of input data by the processing machine may be in response to user commands, or in response to results of previous processing, or in response to a request made by another processing machine.

It is to be understood that the subject matter described herein is not limited in its application to the details of construction and the arrangement of components set forth in the description herein or illustrated in the drawings hereof. The subject matter described herein is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Further, in the following claims, the phrases "at least A or B", "A and/or B", and "one or more of A and B" (where "A" and "B" represent claim elements), are used to encompass i) A, ii) B and/or iii) both A and B.

It is to be understood that the above description is intended to be illustrative, and not restrictive. For example, the above-described embodiments (and/or aspects thereof) may be used in combination with each other. In addition, many modifications may be made to adapt a particular situation or material to the teachings herein without departing from its scope. While the dimensions, types of materials and coatings described herein are intended to define various parameters, they are by no means limiting and are illustrative in nature. Many other embodiments will be apparent to those of skill in the art upon reviewing the above description. The scope of the embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects or order of execution on their acts.

What is claimed is:

1. A device, comprising:
    a housing having display and back surfaces;
    a digital camera unit (DCU) held in the housing and oriented to face the display surface, the DCU including sensor pixels to capture image data for a scene in a field of view of the DCU, the sensor pixels arranged in a sensor matrix with a sensor pixel density;
    a display layer held in the housing proximate to the display surface, the display layer including display pixels arranged in a display matrix having a first pixel density, the display pixels separated by gaps arranged in rows and columns;
    the display layer overlaying the DCU such that a first subset of the sensor pixels align with, and are covered by, the display pixels and a second subset of the sensor pixels align with, and are exposed through, the gaps between the display pixels;
    a processor; and
    memory storing program instructions accessible by the processor, wherein, responsive to execution of the program instructions, the processor performs graphical user interface (GUI) related operations to display content on the display layer and performs an image capture operation to obtain image data utilizing the DCU, wherein, during the image capture operation, the first subset of sensor pixels are blocked by the display pixels and do not capture the image data for the scene;
    the display matrix having the first pixel density in a region overlaying the DCU and having a second pixel density greater than the first pixel density in a region that does not overlay the DCU; and
    wherein and the DCU has a first sensor pixel density in a region overlayed by the region having the first pixel density of the display matrix, and a second sensor pixel density in a region not overlayed by the region having the first pixel density of the display matrix.

2. The device of claim 1, wherein, during the image capture operation, the second subset of sensor pixels capture the image data for a portion of the scene visible to the second subset through the gaps, the image data representing vertical and horizontal strips of the scene corresponding to the rows and columns of the gaps.

3. The device of claim 1, wherein the sensor matrix includes a third subset of sensor pixels that are partially covered by the display pixels and partially exposed through the gaps, the third subset of pixels to capture the image data for a portion of the scene visible to the third subset through the gaps.

4. The device of claim 1, wherein the display pixels comprise a grid of subpixel color elements with the gaps arranged in the rows and columns between the subpixel color elements.

5. The device of claim 1, wherein the sensor pixel density is at least twice the first pixel density of the display matrix.

6. The device of claim 1, wherein the gaps include a first row that overlays and exposes at least two rows of the sensor pixels and include a first column that overlays and exposes at least two columns of the sensor pixels.

7. The device of claim 1, wherein the display matrix comprises a first arrangement of display pixels in a region overlaying the DCU and a second arrangement of display pixels in a region that does not overlay the DCU, the first arrangement different from the second arrangement.

8. The device of claim 1, wherein the first sensor pixel density is greater than the second sensor pixel density.

9. A computer implemented method, the method comprising:
    under control of one or more processors configured with specific executable program instructions,
    capturing image data for a scene in a field of view of a digital camera unit (DCU), the DCU located below a display layer of an electronic device and oriented to face the display surface, the DCU including sensor pixels to capture image data for a scene, the sensor pixels arranged in a sensor matrix with a sensor pixel density;
    displaying content on the display layer of the electronic device, the display layer including display pixels arranged in a display matrix having a first pixel density, the display pixels separated by gaps arranged in rows and columns, the display layer overlaying the DCU, such that a first subset of the sensor pixels align with, and are covered by, the display pixels and a second subset of the sensor pixels align with, and are exposed through, the gaps between the display pixels, wherein, during capturing, the first subset of sensor pixels are blocked by the display pixels and do not capture the image data for the scene; and
    wherein the display matrix has the first pixel density in a region overlaying the DCU and has a second pixel density greater than the first pixel density in a region that does not overlay the DCU; and wherein and the DCU has a first sensor pixel density in a region overlayed by the region having the first pixel density of the display matrix, and a second sensor pixel density in a region not overlayed by the region having the first pixel density of the display matrix.

10. The method of claim 9, wherein, during capturing, the second subset of sensor pixels capture the image data for a portion of the scene visible to the second subset through the gaps, the image data representing vertical and horizontal strips of the scene corresponding to the rows and columns of the gaps.

11. The method of claim 9, wherein the sensor matrix includes a third subset of sensor pixels that are partially covered by the display pixels and partially exposed through the gaps; and
wherein, during capturing, the third subset of pixels capture the image data for a portion of the scene visible to the third subset through the gaps.

12. The method of claim 9, wherein the sensor pixel density is at least twice the first pixel density of the display matrix.

13. The method of claim 9, wherein, during capturing, the gaps include a first row that overlays and exposes at least two rows of the sensor pixels and include a first column that overlays and exposes at least two columns of the sensor pixels.

14. The method of claim 9, wherein the first sensor pixel density is greater than the second sensor pixel density.

15. A computer program product comprising a non-signal computer readable storage medium comprising computer executable code to:
capture image data for a scene in a field of view of a digital camera unit (DCU), the DCU located below a display layer of an electronic device and oriented to face the display surface, the DCU including sensor pixels to capture image data for a scene, the sensor pixels arranged in a sensor matrix with a sensor pixel density;
display content on the display layer of the electronic device, the display layer including display pixels arranged in a display matrix having a first pixel density, the display pixels separated by gaps arranged in rows and columns, the display layer overlaying the DCU, such that a first subset of the sensor pixels align with, and are covered by, the display pixels and a second subset of the sensor pixels align with, and are exposed through, the gaps between the display pixels, wherein, during the capture, the computer executable code does not capture image data for the scene from the first subset of sensor pixels, the first subset of sensor pixels being blocked by the display pixels; and
wherein the display matrix has the first pixel density in a region overlaying the DCU and having a second pixel density greater than the first pixel density in a region that does not overlay the DCU; and
wherein and the DCU has a first sensor pixel density in a region overlayed by the region having the first pixel density of the display matrix, and a second sensor pixel density in a region not overlayed by the region having the first pixel density of the display matrix.

16. The computer program product of claim 15, wherein the first sensor pixel density is greater than the second sensor pixel density.

17. The computer program product of claim 15, wherein, during the capture, the computer executable code captures image data for a portion of the scene visible to the second subset of sensor pixels through the gaps between the display pixels, the image data representing vertical and horizontal strips of the scene corresponding to the rows and columns of the gaps.

18. The computer program product of claim 15, wherein the sensor matrix includes a third subset of sensor pixels that are partially covered by the display pixels and partially exposed through the gaps; and wherein, during the capture, the third subset of pixels capture the image data for a portion of the scene visible to the third subset through the gaps.

* * * * *